United States Patent [19]

Fujimura

[11] Patent Number: 5,024,748
[45] Date of Patent: Jun. 18, 1991

[54] MICROWAVE PLASMA PROCESSING APPARATUS

[75] Inventor: Shuzo Fujimura, Tokyo, Japan

[73] Assignee: Fujitsu Limited, Kawasaki, Japan

[21] Appl. No.: 468,459

[22] Filed: Jan. 22, 1990

[30] Foreign Application Priority Data

Jan. 26, 1989 [JP] Japan .................................. 1-16901

[51] Int. Cl.⁵ .............................................. C23C 14/00
[52] U.S. Cl. ............................ 204/298.38; 204/298.07; 156/345
[58] Field of Search ....................... 204/298.38, 298.07; 156/345

[56] References Cited

U.S. PATENT DOCUMENTS

| | | | |
|---|---|---|---|
| 4,512,868 | 4/1985 | Fujimura et al. | 156/345 |
| 4,609,428 | 9/1986 | Fujimura | 204/298.38 |
| 4,631,105 | 12/1986 | Carroll et al. | 156/345 |
| 4,718,976 | 1/1988 | Fujimura | 156/345 |
| 4,820,370 | 4/1989 | Ellenberger | 156/345 |
| 4,901,667 | 2/1990 | Suzuki et al. | 156/345 |
| 4,931,135 | 6/1990 | Horiuchi et al. | 204/298.35 |

Primary Examiner—John F. Niebling
Assistant Examiner—Steven P. Marquis
Attorney, Agent, or Firm—Armstrong, Nikaido, Marmelstein, Kubovcik & Murray

[57] ABSTRACT

A microwave plasma processing apparatus used for etching or ashing processes of a semiconductor substrate, comprising a plasma generation chamber, into which a reactive gas and microwave power are introduced, a reaction chamber in which the substrate is disposed for processing, and a plasma shield plate separating the reaction chamber from the plasma generation chamber, the plasma shield plate being of electrically conductive material and having at least a hole for flowing the plasma into the reaction chamber and forming a portion of the plasma generation chamber. The microwave plasma processing apparatus of the invention further comprises a cover member disposed on a surface of the plasma shield plate facing the plasma generation chamber and made of inactive material with active species included in the plasma such as quartz and alumina ceramic.

8 Claims, 5 Drawing Sheets

MICROWAVE PLASMA PROCESSING APPARATUS

BACKGROUND OF THE INVENTION

1. Field of the Invention

The present invention relates to a microwave plasma processing apparatus utilized for fabrication processes of semiconductor devices, and particularly to a microwave plasma processing apparatus which has improved productivity with stable performance for a long period of time.

2. Description of the Related Art

An improved type of a microwave plasma processing apparatus has been disclosed in the U.S. Pat. No. 4,512,868 issued on Apr. 23, 1985 to Fujimura et. al. (same as Japanese Unexamined Patent Publication SHO 62-16424). The apparatus has a specific structure that a reactive gas is introduced into a plasma generation chamber, microwave power is introduced therein, the plasma which comprises active species is generated in the reactive gas, the active species are introduced into a separate reaction chamber arranged adjacent to the plasma generation chamber, and a substrate is disposed and processed in the reaction chamber. An outline of the disclosure will be explained with reference to FIG. 1.

FIG. 1 is a schematic cross section of the microwave plasma processing apparatus. A microwave generator 1 supplies microwave power which is transmitted into a reactor 3 through a waveguide 2 and a window 4 which seals the reactor 3 vacuum tight and makes the microwave power penetrate therethrough. The reactive gas including at least oxygen ($O_2$) flows into the reactor 3 through an inlet pipe 5 as shown by an arrow a. In the reactor 3, a plasma shield plate 6 made of aluminum is provided, dividing the reactor 3 into the plasma generation chamber 3a and the reaction chamber 3b. The plasma shield plate 6, which is sometimes called a shower head, has a plurality of small holes 6a. A substrate 7 is arranged on a stage 8 in the reaction chamber 3b. The gas after reaction is exhausted through an exhaust pipe 3c as shown by an arrow b.

The microwave power of a few giga Hz in frequency excites the reactive gas within the plasma generation chamber 3a and generates plasma comprising active species. The uniformly diffused plasma in the plasma generation chamber 3a flows into the reaction chamber 3b through small holes 6a as shown by an arrow c. However, most of the charged particles such as ions in the plasma remain in the plasma generation chamber 3a. The neutral active species flow into the reaction chamber 3b with uniform distribution.

A resist layer coated on a surface of the substrate 7 reacts with the active species, resulting in performing uniform etching or ashing processes onto the entire surface of the substrate 7.

For example, a mixed gas of oxygen($O_2$) and carbon tetrafluoride ($CF_4$) in the ratio of 8:2 is used as the reactive gas and the microwave power of about 0.4 KW and 2.45 GHz is applied into the plasma generation chamber 3a. The reaction chamber 3b is evacuated at about 0.3 Torr. A good result of ashing process for the resist layer has been obtained.

Another improvement of a microwave plasma processing apparatus has been disclosed in the U.S. Pat. No. 4718976 issued on Jan. 12, 1988 to Fujimura (same as Japanese Allowed Patent Publication SHO 62-1534). An outline of the structure thereof is shown in FIG. 2. The same reference numerals designate the same or similar parts in the drawing. A plasma generation chamber 3a is separated from a reaction chamber 3b in the similar way as shown in FIG. 1, however, active species comprised in the plasma are introduced into the reaction chamber 3b through a flow rate control means 11a (conductance controller).

In FIG. 2, the conductance controller 11a is provided at the center of metallic, for example, aluminum plasma shield plate 11 which divides reactor 3 into two sections of the plasma generation chamber 3a and reaction chamber 3b. A circular gas diffusion plate 12 is arranged in the reaction chamber 3b, and it has dimension of a diameter d and a predetermined distance h from the plasma shield plate 11 such that the plasma introduced through the conductance controller 11a can diffuse outwardly and uniformly after collision with the gas diffusion plate 12. And further, a funnel-shaped reflector 13 is provided outside the gas diffusion plate 12 and upon a substrate 7, and the reflector 13 works to make the plasma direct onto the substrate 7.

The reactive gas is introduced into the plasma generation chamber 3a from an inlet pipe 5 as shown by an arrow a'. The reactive gas is excited by microwave power, and the generated plasma flows into the reaction chamber 3b passing through the conductance controller 11a and further diffuses onto the substrate 7 along a path shown by an arrow c'

When the diameter d of the gas diffusion plate 12 and the distance h from the plasma shield plate 11 are set at optimum values, satisfactory results can be obtained.

Further the following patent applications which are related to a microwave plasma processing apparatus have been filed by Fujimura et. al.

U.S. application Ser. No. 802,332 filed on Nov. 27, 1985 (same as Japanese Unexamined Patent Publication SHO 61-131454).

U.S. application Ser. Appl. No. 24,070 filed on Mar. 10, 1987 (same as Japanese Unexamined Patent Publication SHO 62-213126).

The above two applications are related with a structure for a microwave window which partitions a plasma generation chamber from a microwave waveguide, and the details thereof are omitted herein.

Throughout all references cited above, etching or ashing processes are carried out using a reactive gas including oxygen. Because the plasma shield plate 6 or 11 shown in FIGS. 1 and 2 respectively is made of aluminum, the exposed surface of the plasma shield plate 6 to the plasma generation chamber 3a reacts with the active species of the plasma, resulting in reducing the active species.

As a result, a processing rate decreases gradually with the utilization period of the apparatus compared with the data obtained at an initial stage when the plasma shield plate is covered with a natural oxide film only.

In an experiment, wherein a reactive gas of $O_2+CF_4$ (8% $CF_4$ content) is used and microwave power of 1.5 KW at 2.45 GHz is applied, an ashing rate of about 1.5 $\mu$m/min has been obtained for a resist layer on a substrate at an initial stage when the plasma shield plate has a natural oxide film only. However, after utilization of the apparatus for about three months, eight hour operation per day, the ashing rate decreases to 5000 Å/min, which is about ⅓ of the data at the initial stage.

Such phenomenon is observed even in a case when the aluminum surface of the plasma shield plate is beforehand processed with alumite treatment.

The existing microwave plasma processing apparatus has a drawback in that processing capability in a unit time gradually deteriorates during utilization thereof.

SUMMARY OF THE INVENTION

It is an object of the invention to provide a microwave plasma processing apparatus which will not show remarkable deterioration in processing capability for a long operating period.

It is another object of the invention to provide a microwave plasma processing apparatus in which reaction of active species with plasma shield plate is prevented.

It is still another object of the invention to provide a microwave plasma processing apparatus in which a function of confining plasma in a plasma generation chamber is not lost and active species of the plasma are stably introduced into a reaction chamber.

In order to achieve the above objects, the present invention provides a microwave plasma processing apparatus comprising a plasma generation chamber for generating plasma by irradiating microwave power to a reactive gas introduced therein, and a reaction chamber located on a downstream side of the reactive gas, a substrate to be processed being disposed therein, and a plasma shield plate separating the reaction chamber from the plasma generation chamber, the plasma shield plate being of electrically conductive material and having at least a hole for the plasma to flow into the reaction chamber. The microwave plasma processing apparatus of the invention further comprises a cover member disposed on a surface of the plasma shield plate facing the plasma generation chamber and made of inactive material with active species comprised in the plasma.

BRIEF DESCRIPTION OF THE DRAWINGS

Throughout the drawings, the same reference numeral designate and identify the same or similar parts.

DETAILED DESCRIPTION OF THE PREFERRED EMBODIMENTS

Figure 3:
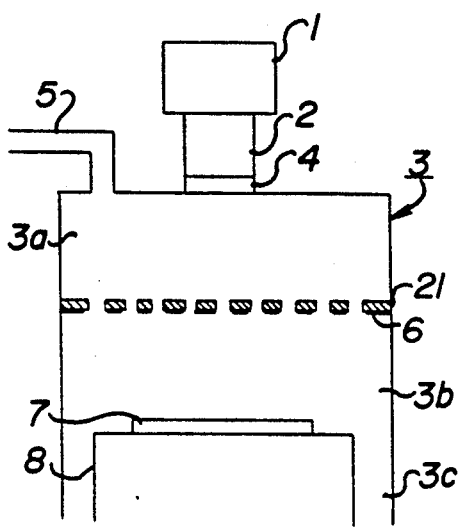
FIG. 3 is a schematic sectional view for explaining the structure of a first embodiment of a microwave plasma processing apparatus of the present invention.

FIG. 3 is a schematic sectional view of a first embodiment of a microwave plasma processing apparatus of the present invention. The apparatus shown in FIG. 3 is similar as that shown in FIG. 1 except that the entire surface of a plasma shield plate 6, in other words, a shower head facing to a plasma generation chamber 3a is covered with a quartz cover 21 having a thickness of about 2 mm.

Figure 1:
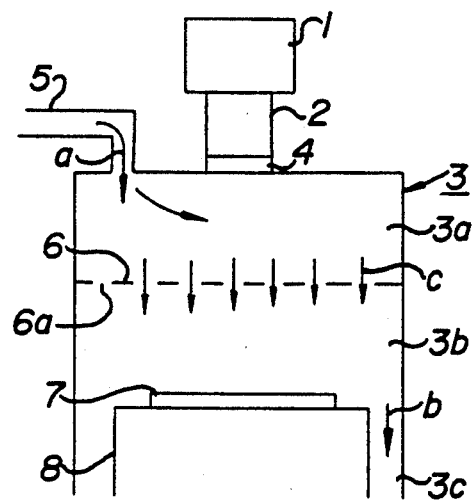
FIGS. 1 and 2 are schematic sectional views of an existing microwave plasma processing apparatus.

Herein, comparison tests between the existing structure of FIG. 1 and that of FIG. 3 of the present invention are explained. Tests are conducted under the conditions of that a mixed gas of $O_2+N_2$ (10% $N_2$ content) is used as a reactive gas, microwave power of 1.5 KW and 2.45 GHz is applied into the plasma generation chamber 3a, a vacuum degree in the reaction chamber is maintained at about 1 Torr, a substrate is disposed on a stage 8 and heated up to 200° C., and a resist layer on the substrate 7 is subjected to ashing process for 60 to 90 seconds.

Using the existing apparatus of FIG. 1, tests are conducted for three months, ashing processes being repeated 500 times per day. At the beginning of the test, an ashing rate of 1 μm/min has been measured. However, at the end of the three month test, the ashing rate has deteriorated to 6000 Å/min, which shows a 40 % decrease from the initial data.

The similar tests are conducted using the same microwave plasma processing apparatus after the above test. However, the structure thereof is changed such that the quartz cover 21 is added onto the plasma shield plate 6 facing to the plasma generation chamber 3a. The ashing rate has increased to about 9000 ÅA/min from 6000 Å/min and maintained during almost the whole period of the subsequent three month tests.

Therefore, the microwave plasma processing apparatus having stable performance for a long period of time without lowering productivity can be easily obtained by covering the entire surface of metallic plasma shield plate facing the plasma generation chamber with an insulating member such as the quartz cover 21.

Figure 2:
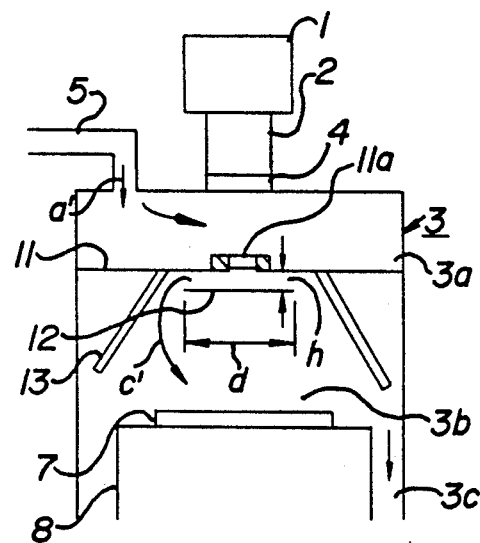
Figure 4:
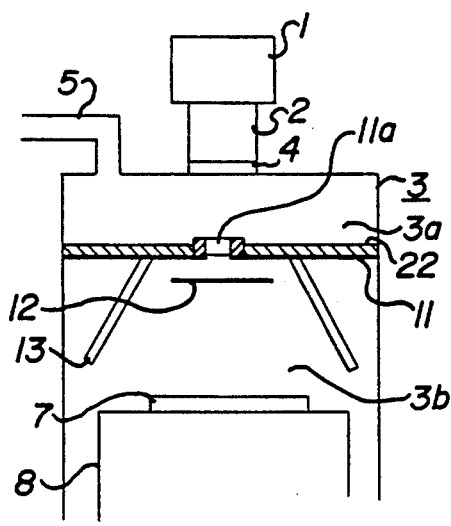
FIG. 4 is a schematic sectional view of a second embodiment of a microwave plasma processing apparatus of the present invention.

FIG. 4 is a schematic sectional view of a second embodiment of the present invention. The second embodiment shows an application of the present invention to the existing structure of FIG. 2. In FIG. 4, a quartz cover 22 is arranged on a plasma shield plate 11 facing to a plasma generation chamber 3a. The similar improvements have been confirmed on durability for the embodied apparatus.

Figure 5:
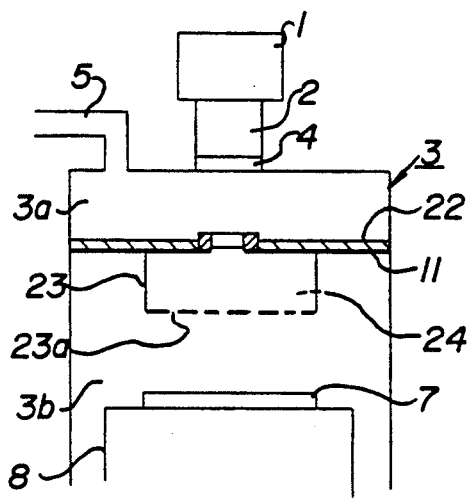
FIG. 5 is a schematic sectional view of a third embodiment of a microwave plasma processing apparatus of the present invention.

FIG. 5 is a schematic sectional view of a third embodiment of the present invention. In the third embodiment, the flat gas diffusion plate 12 of FIG. 4 is replaced by a cylindrical diffuser 23 having a plurality of holes 23a at the bottom surface thereof. The diffuser 23 is located on a downstream side of the reactive gas and fixed to the bottom surface of a plasma shield plate 11 and forming a diffusion chamber 25 of the plasma. A quartz cover 22 is arranged on the surface of the plasma shield plate 11 facing to the a plasma generation chamber 3a. In this case, the reflector 13 of FIG. 4 is unnecessary.

In the third embodiment of FIG. 5, active species and charged particles comprised in the plasma flows into a diffusion chamber 24 restricted by the cylindrical diffuser 23 and, after lingering for a while, the active species diffuses into a reaction chamber 3b through a plurality of small holes 23a. The similar improvements have been also confirmed on durability of the third embodiment.

Figure 6:
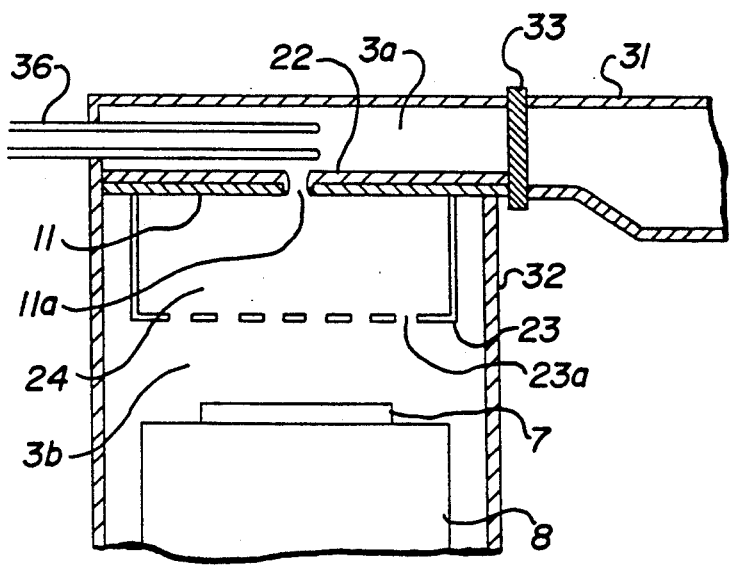
FIG. 6 is a schematic partial sectional view of of a fourth embodiment of a microwave plasma processing apparatus in which the plasma generation chamber of the third embodiment is modified.

FIG. 6 shows a schematic sectional view of a fourth embodiment, in which the plasma generation chamber 3a of FIG. 5 has been modified. Other portions except for the plasma generation chamber are the same as those of FIG. 5. One end of a waveguide 31 is integrated with a plasma generation chamber 3a and a reactor 32, and is partitioned by a microwave window 33. And the other end thereof is connected to a microwave generator (not shown). A plasma shield plate 11 which forms a wall part of the plasma generation chamber 3a, has a through hole 11a of a predetermined diameter at the center thereof.

A quartz cover 22 of 2 mm in thickness is attached as to cover the entire surface of the plasma shield plate facing to the plasma generation chamber. A gas inlet pipe 36 is loaded to the side wall of the plasma generation chamber 3a so that the gas spouts near the through hole 11a of the plasma shield plate 11. A cylindrical gas diffuser 23 is fixed to the bottom surface of the plasma shield plate 11 and a substrate 7 is disposed on a stage 8 as those shown in FIG. 5.

In the fourth embodiment of FIG. 6, a region surrounded by the microwave window 33, the plasma shield plate 11 with the quartz cover 22 and walls forming an end portion of the reactor 32 forms the plasma generation chamber 3a. The active species and some of the charged particles comprised in the plasma flow into a diffusion chamber 24 through the hole 11a. The diffusion chamber 24 is surrounded by the cylindrical diffuser 23, therefore, the active species of the plasma linger therein for a while and diffuse uniformly onto the substrate surface in a reaction chamber 3b through a plurality of small holes 23a. This type of the embodiment also shows satisfactory performance without deterioration in ashing rate for a long period of operation.

In the explanation of the above embodiments of FIG. 3 through FIG. 6, the ashing process using the reactive gas containing oxygen ($O_2$) is considered, however, the microwave plasma apparatus in accordance with the present invention may be applied for etching processes by utilizing a proper reactive gas.

It is necessary that the plasma generation chamber of microwave plasma processing apparatus is surrounded by walls of an electrically conductive material in order to confine microwave power introduced therein and the plasma generated thereby. Particularly, in case of processing a semiconductor substrate, the electrically conductive material is limited only to aluminum (Al).

In case the reactive gas in which carbon tetrafluoride ($CF_4$) or nitrogen ($N_2$) is mixed in oxygen ($O_2$), is used, active oxygen species show recombination or reaction with an aluminum surface exposed to the plasma generation chamber. Because the surface of plasma shield plate of the existing microwave plasma processing apparatus faces to and is exposed to the plasma generation chamber, it has been proved that the recombination or reaction of the active oxygen species with aluminum surface thereof results in a rapid decrease of etching or ashing capabilities and can not be neglected.

The present invention employs the structure that at least the surface of plasma shield plate 6 or 11 facing the plasma generation chamber 3a is covered with the material not easily reacted with the plasma. In other words, the plasma shield plate is covered with material with which the active species of the plasma have a smaller recombination coefficient than that with the conductive material such as aluminum of the plasma shield plate. The insulation material such as quartz and alumina ceramic is used as the material for covering the plasma shield plate. Furthermore, since the material is heated during the process, the thickness thereof is required to be greater than 1 mm, preferably about 2 mm.

If the surface of the plasma shield plate is covered with the insulating material by a coating or glazing method, the covering insulation layer shows cracking or peeling phenomena due to thermal stresses and loses its function.

According to the present invention as shown in FIG. 3 to FIG. 6, the surface of plasma shield plate 6 or 11 of aluminum facing the plasma generation chamber 3a is covered with the cover member 21 or 22 respectively, and the cover member will not deteriorate a confining function of the plasma into the plasma generation chamber 3a and will not consume the active species.

Figure 7:
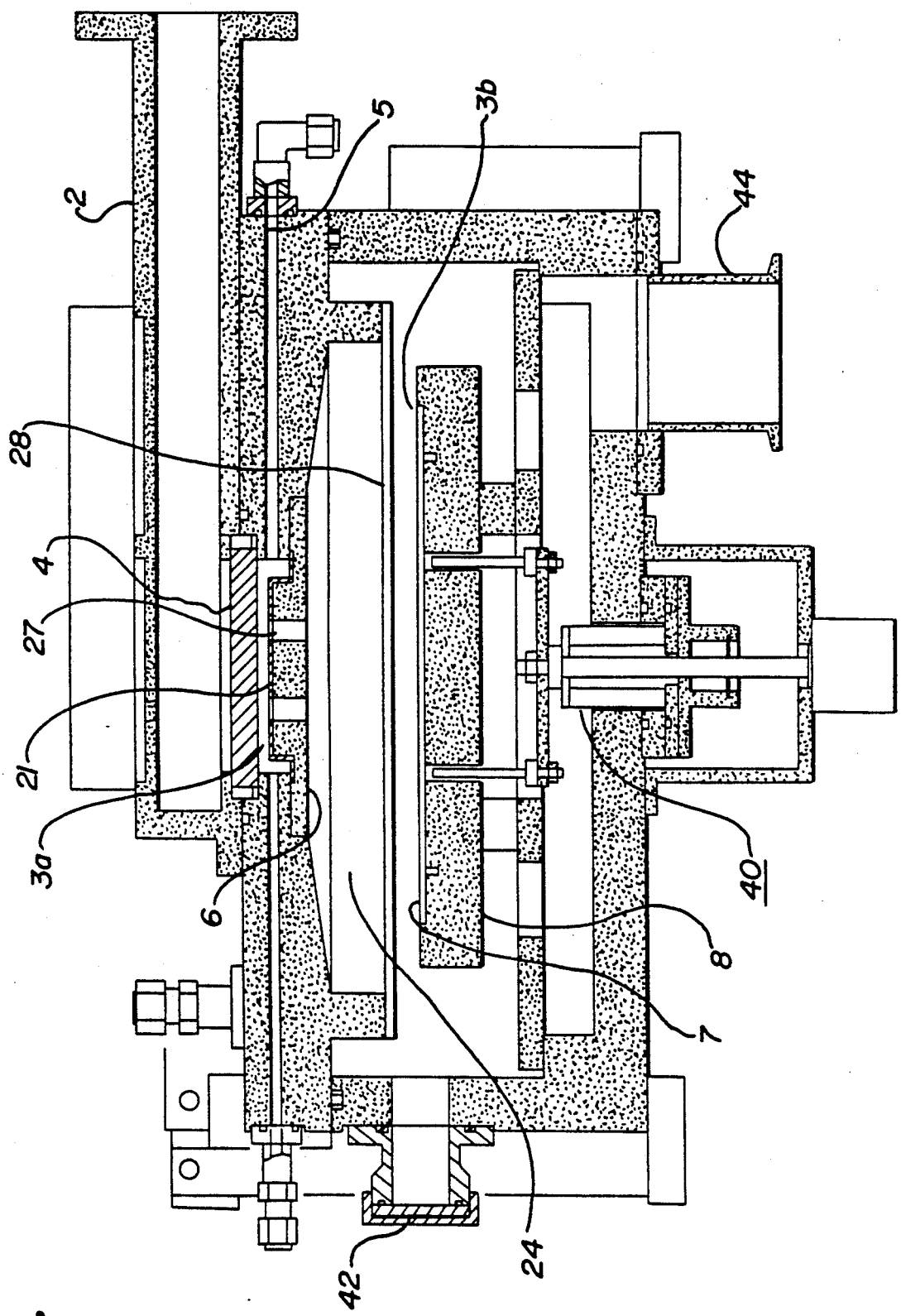
FIG. 7 is a sectional view of the detailed structure of a microwave plasma processing apparatus in which the first and third embodiments are combined.

In explaining the first through fourth embodiments of FIG. 3 to FIG. 6, the details of the structure are omitted for simplification. FIG. 7 shows a cross sectional view of an actual structure the microwave plasma processing apparatus when the first embodiment of FIG. 3 and the third embodiment of FIG. 5 are combined.

Figure 8A:
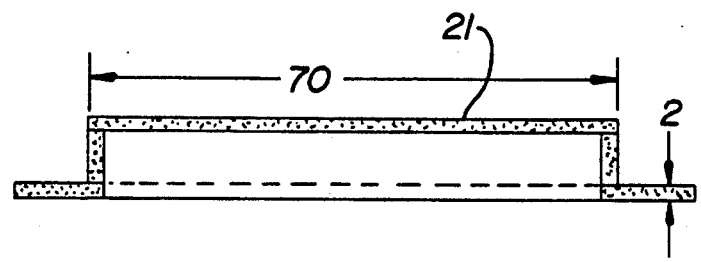
FIGS. 8(a) and 8(b) are a sectional view and a bottom view respectively of a quartz cover member of the present invention used in FIG. 7.
Figure 8B:
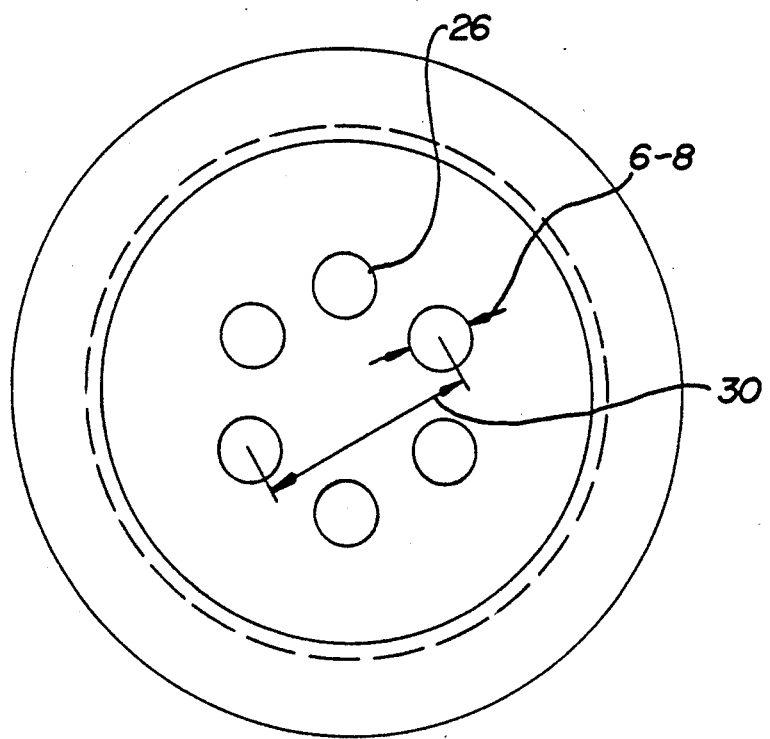

In FIG. 7, a microwave window 4 is arranged along a longitudinal wall direction of waveguide 2 and a reactive gas is introduced into a plasma generation chamber 3a flowing through an inlet pipe 5. A plasma shield plate 6 is formed of a thick aluminum plate and is covered with a cap-shaped quartz cover 21. The quartz cover 21 has a cross sectional view shown in FIG. 8(a) and has a bottom view of FIG. 8(b), and it has six holes 26, the dimensions thereof being shown therein. The plasma flows in a diffusion chamber 24 through the holes of quartz cover 21 and holes 27 of the plasma shield plate 6.

Charged particles such as ions and electrons entering into the diffusion chamber 24 are almost removed by the plasma shield plate 6, and some charged particles partly entering therein are removed further by a diffusion plate 28 which provides a plurality of small holes (not shown). Active species flow from the diffusion chamber 24 uniformly onto a substrate 7 disposed on a stage 8. Vertical position of the substrate 7 can be adjusted by a mechanism 40. The gas is finally exhausted from an exhaust pipe 44. Progress of the plasma processing can be monitored through a window 42.

Figure 9:
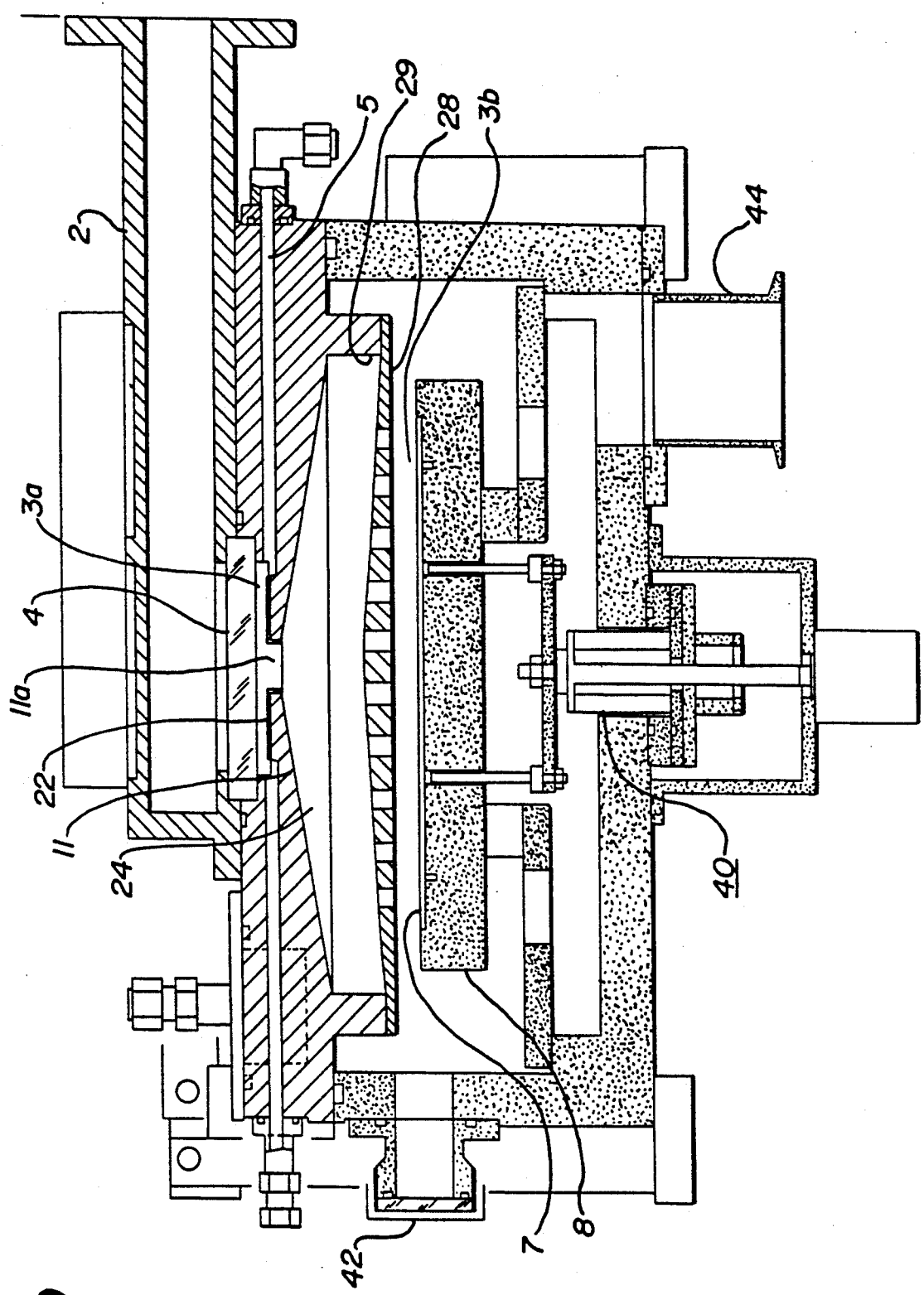
FIG. 9 is a sectional view of the detailed structure of a microwave plasma processing apparatus almost similar as the third embodiment of the present invention.

FIG. 9 shows a detailed structure of an actual microwave plasma processing apparatus in accordance with the third embodiment of FIG. 5. Arrangements of waveguide 2 and microwave window 4 are almost the same as those shown in FIG. 7. A quartz cover 22 provides a single hole 11a at the center thereof, and a region surrounded by a plasma shield plate 11, diffusion plate 28 and a side wall 28 forms a diffusion chamber 24. The other structure is almost the same as that of FIG. 7, therefore omitted here.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalence of the claims are, therefore, to be embraced therein.

I claim:

1. A microwave plasma processing apparatus, comprising:
   a plasma generation chamber for generating plasma by irradiating microwave power to a reactive gas introduced therein,
   a reaction chamber disposed on a downstream side of the reactive gas for receiving a substrate to be processed therein,
   a plasma shield plate separating the reaction chamber from the plasma generation chamber, the plasma shield plate being of electrically conductive material and having at least a hole for allowing the plasma to flow into the reaction chamber and forming a portion of the plasma generation chamber, and
   a separate cover member disposed on the surface of said plasma shield plate facing the plasma generation chamber, said cover member being of a sufficient thickness to prevent cracking or peeling phenomena due to thermal stresses, and made of an inactive material with respect to the active species included in the plasma.

2. A microwave plasma processing apparatus as recited in claim 1, wherein said cover member is of the material with which the active species of the plasma have a smaller recombination coefficient than that with said conductive material of the plasma shield plate.

3. A microwave plasma processing apparatus as recited in claim 1, wherein said electrically conductive material of the plasma shield plate is a metal comprising aluminum.

4. A microwave plasma processing apparatus as recited in claim 1, wherein the material of said cover member is quartz.

5. A microwave plasma processing apparatus as recited in claim 1, wherein the material of said cover member is alumina ceramic.

6. A microwave plasma processing apparatus as recited in claim 1, wherein said reactive gas to generate the plasma includes oxygen.

7. A microwave plasma processing apparatus as recited in claim 6, wherein said reactive gas to generate the plasma further includes fluoride containing gas or-/and nitrogen gas.

8. A microwave plasma processing apparatus as recited in claim 1, wherein said reaction chamber is partitioned forming a diffusion chamber located on the bottom side of the plasma shield plate, and the plasma shield plate including said hole forms an upper portion of the diffusion chamber and a diffusion plate forms a lower portion thereof, the diffusion plate having a plurality of another holes facing the substrate in the reaction chamber.

* * * * *